United States Patent
Goetz et al.

(12) 
(10) Patent No.: US 6,639,150 B1
(45) Date of Patent: Oct. 28, 2003

(54) HERMETIC PACKAGE FOR SURFACE ACOUSTIC WAVE DEVICE HAVING EXPOSED DEVICE SUBSTRATE CONTACTS AND METHOD OF MANUFACTURING THE SAME

(75) Inventors: Martin P. Goetz, Dallas, TX (US); Merrill A. Hatcher, Garland, TX (US); Christopher E. Jones, Arlington, TX (US)

(73) Assignee: Clarisay, Inc., Dallas, TX (US)

( * ) Notice: Subject to any disclaimer, the term of this patent is extended or adjusted under 35 U.S.C. 154(b) by 0 days.

(21) Appl. No.: 10/003,157

(22) Filed: Apr. 23, 2002

(51) Int. Cl.$^7$ ............................. H05K 5/06; H01L 23/28
(52) U.S. Cl. ................... 174/52.3; 257/704; 361/807; 361/761
(58) Field of Search ................ 174/52.3, 52.4; 257/678, 684, 690, 704, 730, 778; 361/728, 736, 807, 809, 761, 764; 438/106, 107, 118, 125

(56) References Cited

U.S. PATENT DOCUMENTS

| | | | |
|---|---|---|---|
| 4,920,801 A | | 5/1990 | Church |
| 5,045,921 A | * | 9/1991 | Lin et al. ............... 257/680 |
| 5,235,135 A | | 8/1993 | Knecht et al. |
| 5,345,134 A | | 9/1994 | Greer |
| 5,365,402 A | * | 11/1994 | Hatada et al. ........... 361/699 |
| 5,699,027 A | | 12/1997 | Tsuji et al. |
| 5,805,427 A | * | 9/1998 | Hoffman ................ 361/770 |
| 5,834,839 A | * | 11/1998 | Mertol ................... 257/704 |
| 5,896,636 A | | 4/1999 | Penunuri |
| 5,917,265 A | | 6/1999 | Naumenko et al. |
| 5,952,765 A | | 9/1999 | Garber et al. |
| 6,114,635 A | | 9/2000 | Lakin et al. |
| 6,181,015 B1 | | 1/2001 | Gotoh |
| 6,225,692 B1 | | 5/2001 | Hinds |
| 6,262,513 B1 | | 7/2001 | Furukawa |
| 6,321,444 B1 | | 11/2001 | Yatsuda et al. |

FOREIGN PATENT DOCUMENTS

JP 8-32402 2/1996

OTHER PUBLICATIONS

"Feasibility of Surface Activated Bonding for Ultra–fine Pitch Interconnection—a New Concept of Bump–less Direct Bonding for System Level Packaging" by T. Suga; 2000 IEEE; 4 pages.

"A Novel Temperature Compensation Method for SAW Devices Using Direct Bonding Techniques" by K. Onishi, A Namba, H. Sato, T. Ogura, S. Seki, Y. Taguchi, Y. Tomita, O. Kawasaki and K. Eda; 1997 IEEE; pp. 227–230.

(List continued on next page.)

*Primary Examiner*—Dean A. Reichard
*Assistant Examiner*—Carmelo Oliva (57) ABSTRACT

A hermetic package for an electronic device, such as a surface acoustic wave (SAW) device and a method of manufacturing the same. In one embodiment, the package includes: (1) a device substrate having: (a) an active region containing an electrically conductive pattern that constitutes at least a portion of the device, (b) a contact region surrounding the active region and containing bond pads that are electrically coupled to the pattern and (c) a bonding region surrounding the active region, (2) a non-porous mounting substrate having a bonding region thereon and a footprint smaller than a footprint of the device substrate and (3) a bonding agent, located between the bonding region of the device substrate and the bonding region of the mounting substrate, that bonds the device substrate to the mounting substrate to enclose the active region proximate a void between the device substrate and the mounting substrate, the contact region remaining exposed.

32 Claims, 6 Drawing Sheets

OTHER PUBLICATIONS

"Silicon Wafer Bonding for MEMS Manufacturing" by A. A. Ayon; Solid State Technology Publication; Aug. 1999; 6 pages.

"Direct Bonding of Piezoelectric Materials Onto Si" by Kazuo Eda, Yoshihiro Tomita, Masato Sugimoto, Tetsuyoshi Ogura, Akihiko Nanba, Yutaka Taguchi and Osamu Kawasaki; 1996 IEEE; pp. 719–722.

"Si/Si Interface Bonded at Room Temperature by Ar Beam Surface Activation" by H. Takagi, R. Maeda, N. Hosoda and T. Suga; 1999; pp. 341–344.

"Even–Order Thickness–Shear Mode Resonators Using X–Cut Lita03 Plates Realized by a Direct Bonding Technique" by M. Sugimoto, K. Takeda, T. Ohtsuchi, Y. Tomita and O. Kawasaki 1998–IEEE; pp. 919–923.

* cited by examiner

HERMETIC PACKAGE FOR SURFACE ACOUSTIC WAVE DEVICE HAVING EXPOSED DEVICE SUBSTRATE CONTACTS AND METHOD OF MANUFACTURING THE SAME

TECHNICAL FIELD OF THE INVENTION

The present invention is directed, in general, to surface acoustic wave circuits and, more specifically, to a hermetic package for a surface acoustic wave (SAW) device and a method of manufacturing the package.

BACKGROUND OF THE INVENTION

Electronic signal processing by means of surface acoustic wave (SAW) devices has been widely adopted by the electronics industry. Such SAW devices can be designed to operate as analog electrical filters that operate at over a wide range of frequencies and have several advantages over conventional technologies. One such advantage is that they can be designed to provide complex signal processing in a single unit. SAW devices also benefit from the ability to be mass produced using semiconductor microfabrication techniques which produces highly uniform devices at a substantially reduced cost. SAW devices can be easily integrated into many digital communications systems and designed to operate in high harmonic modes in the gigahertz (GHz) frequency range.

The response characteristics of a particular SAW device are governed by several factors. One is the geometry of conductors laid out on the SAW resonator's piezoelectric substrate. A typical geometry for a SAW resonator includes first and second SAW finger sets. Portions of the finger sets are interdigitated in a central region of the SAW resonator and are employed to generate or attenuate acoustic waves. Additional non-interdigitated finger sets lie outside of the central region and serve to reflect acoustic waves back into the central region. Proper operation and containment of the acoustic waves require precise construction of both the central and outlying regions.

The interdigitated finger sets act as input and output signal ports when an AC voltage is applied to the signal input portion of the metal lines. Application of an appropriate input electrical AC signal provides the stimulus to create an acoustic wave that may typically be a Rayleigh wave with motion confined to about one acoustic wavelength under the free surface of the piezoelectric substrate. Alternatively, the acoustic excitation may be a "leaky wave," which also finds application in modern radio frequency devices. This wave propagates to the receiver portion. The fingers corresponding to the signal receiving portion draw energy from the acoustic wave in the lattice and convert it into a filtered electrical signal.

Conventional SAW devices include a device substrate and a mounting substrate sandwiching the SAW circuit, the device and mounting substrates having similar footprints. The similarity of the footprints conceals the contact pads on the mounting surface of the device substrate, thereby necessitating the use of vias. The vias are drilled through the device substrate and/or the mounting substrate to expose portions of the contact or bond pads sandwiched between the substrates and subsequently filled with metal. The vias thereby provide conduction paths from the sandwiched SAW circuit bond pads to circuit contacts on the outer surface of the SAW device. The necessity of such vias is an undesirable effect of the similarity of the footprints of the device and mounting substrates. Incorporating the vias requires additional manufacturing steps and materials, thereby increasing the production time and costs associated with each SAW unit. Use of the vias also limits the number of connection configurations employable in subsequent circuit integration.

Accordingly, what is needed in the art is a surface acoustic wave device and a method of manufacturing a surface acoustic wave device that provides improved access to SAW circuit contacts while maintaining or improving device production time and costs.

SUMMARY OF THE INVENTION

To address the above-discussed deficiencies of the prior art, the present invention provides a hermetic package for an electronic device and methods of manufacturing one or more of such packages. In one embodiment, the package includes: (1) a device substrate having: (1a) an active region containing an electrically conductive pattern that constitutes at least a portion of the device, (1b) a contact region surrounding the active region and containing bond pads that are electrically coupled to the conductive pattern and (1c) a bonding region surrounding the active region, (2) a non-porous mounting substrate having a bonding region thereon and a footprint smaller than a footprint of the device substrate and (3) a bonding agent, located between the bonding region of the device substrate and the bonding region of the mounting substrate, that bonds the device substrate to the mounting substrate to enclose the active region proximate a void between the device substrate and the mounting substrate, the contact region remaining exposed.

The present invention therefore introduces the broad concept of hermetically packaging an electronic device while leaving its bond pads exposed. This eliminates the need for further routing of conductors within the package.

In one embodiment of the present invention, the active region is sunken into the device substrate relative to the bonding region thereof to accommodate at least a portion of the void. In an alternative embodiment, a central region of the mounting substrate is sunken into the mounting substrate relative to the bonding region thereof to accommodate at least a portion of the void. In another alternative embodiment, both the device and mounting substrates have sunken portions that together accommodate the void. In another embodiment, a recess in the bonding agent accommodates the void, the recess corresponding to the active region.

In one embodiment of the present invention, the contact region is exposed to allow the bond pads to be used for wire bonding. In an alternative embodiment, one or more of the bond pads have a vertical conductor formed thereon, wherein the vertical conductor may be a stud bump. Of course, other methods of electrically coupling the packaged device to surrounding circuitry are within the broad scope of the present invention.

In one embodiment of the present invention, the device substrate includes at least one selected from the group consisting of: (1) bismuth germanium oxide, (2) gallium arsenide, (3) lithium borate, (4) lithium niobate, (5) lithium tantalate, (6) langasite, (7) lead zirconium tantalate and (8) quartz. Those skilled in the art will understand, however, that other materials may be suitable for use as a device substrate, depending upon the particular application involved.

In one embodiment of the present invention, the mounting substrate includes at least one selected from the group consisting of: (1) ceramic and (2) silicon. Those skilled in the art will understand, however, that other materials may be suitable for use as a mounting substrate, depending upon the particular application involved.

In one embodiment of the present invention, the device is selected from the group consisting of: (1) a surface acoustic wave device, (2) a micro-electromechanical system device, (3) a mirror device and (4) a piezoelectric device. Those skilled in the art will understand, however, that other devices are within the broad scope of the present invention.

In one embodiment of the present invention, the footprint of the mounting substrate is a quadrilateral. Of course, other footprint shapes are within the broad scope of the present invention. For example, the footprint of the mounting substrate may have an irregular shape that exposes only the portions of the contact region that contain the bond pads.

In one embodiment of the device, the package further includes a carrier substrate coupled to the device substrate or mounting substrate. Those skilled in the art will understand how such a carrier substrate may be used to comply with industry standard mounting footprints which may differ from a footprint of the mounting substrate.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
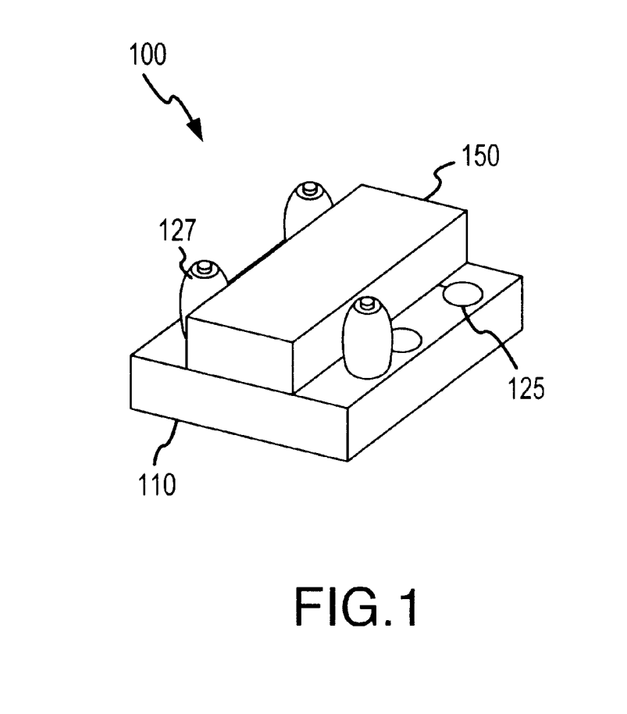
FIG. 1 illustrates a hermetic package 100 for an electronic device constructed according to the principles of the present invention.
Figure 2:
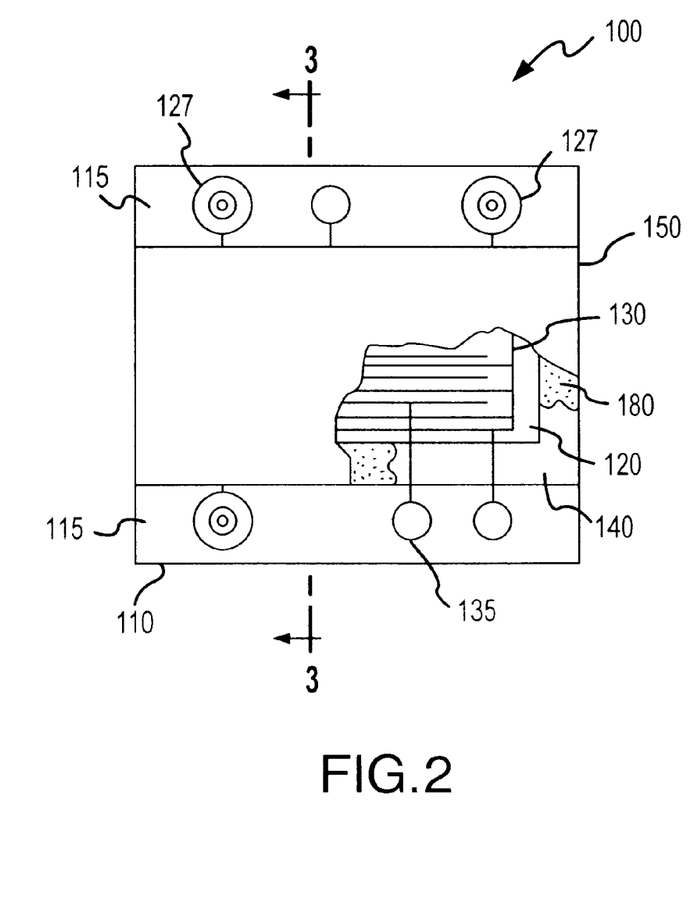
FIG. 2 illustrates the hermetic package 100 shown in FIG. 1, the illustration depicting portions of a mounting substrate 150 and a hermetic adhesive 180 removed for clarity.

Referring initially to FIGS. 1 and 2, illustrated is an electronic device hermetic package 100 constructed according to the principles of the present invention. The package 100 includes a device substrate 110, a non-porous mounting substrate 150 and a nonmetallic hermetic sealing adhesive 180.

The device substrate 110 may include at least one selected from the group consisting of bismuth germanium oxide, gallium arsenide, lithium borate, lithium niobate, lithium tantalate, langasite, lead zirconium tantalate and quartz. Those skilled in the art will understand, however, that other materials may be suitable for use as the device substrate 110, depending upon the particular application involved. The device substrate 110 includes an active region 120, containing an electrically conductive pattern 130 that constitutes at least a portion of an electronic device, a contact region 115 surrounding the active region 120 and containing bond pads 135 that are electrically coupled to the pattern 130 and a bonding region 140 surrounding the active region 120.

In the illustrated embodiment, a footprint of the device substrate 110 exceeds a footprint of the mounting substrate 150 at least to the extent that the portions of the contact region 115 containing the bond pads 135 remain exposed. In the illustrated embodiment, the device substrate 110 and mounting substrate 150 have a substantially quadrilateral footprint. However, in one embodiment, the footprint of the mounting substrate 150 may take on a more irregular shape, and may include scalloped or notched features exposing those portions of the contact region 115 containing the bond pads 135.

In one embodiment, the contact region 115 is exposed to allow the bond pads 135 to be used for wire bonding. Of course, other methods of electrically coupling the packaged device 100 to surrounding circuitry are within the broad scope of the present invention. In the illustrated embodiment, one or more vertical conductors 127 are in electrical communication with one or more bond pads 135, thereby providing means for mechanically and/or electrically coupling the package 100 to external circuitry (not shown). The vertical conductors 127 may be stud bumps, such as those formed by melting a sphere of metal at the tip of a conductive wire and cutting the wire above the sphere to form a tail.

The stud bumps may include gold, silver, a gold-tin alloy, palladium or copper. The vertical conductors 127 may also be simultaneously flattened to ensure uniform height thereof. In one embodiment, the vertical conductors 127 are at least as tall as the mounting substrate 150. In an alternative embodiment, the vertical conductors 127 may include a conventional conductive paste (not shown).

Figure 3:
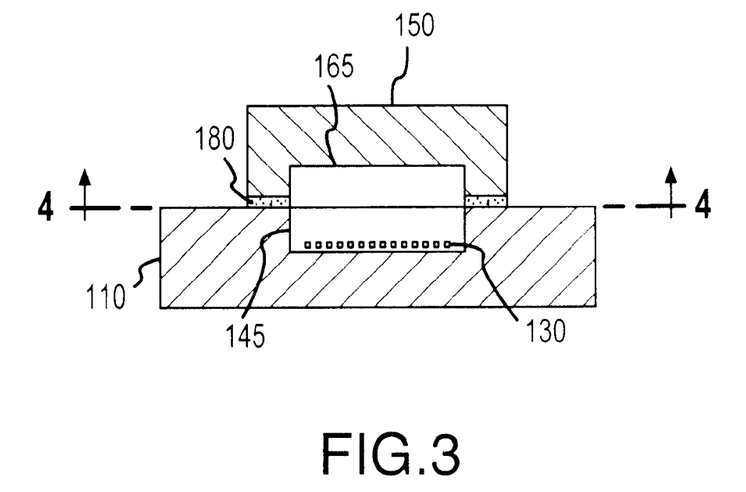
FIG. 3 illustrates a section view of the hermetic package 100 shown in FIG. 2.
Figure 4:
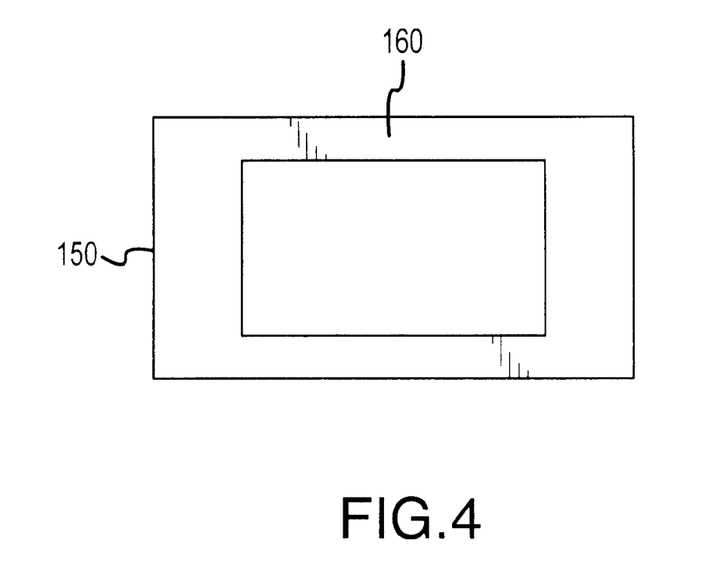
FIG. 4 illustrates a section view of the hermetic package 100 shown in FIG. 3, the illustration depicting a hermetic adhesive 180 removed from a mounting substrate 150 for clarity.

Turning now to FIGS. 3 and 4, and with continued reference to FIG. 2, illustrated are section views of the hermetic package 100 shown in FIG. 2. The non-porous mounting substrate 150, which may include ceramic and/or silicon, includes the bonding region 160 formed by at least a portion of the surface of the mounting substrate 150 nearest the device substrate 110. The bonding region 160 may have a footprint at least partially conforming to a footprint of the bonding region 140 on the device substrate 110. In a preferred embodiment, the mounting substrate 150 is 50–100 $\mu$m thick, but other embodiments may include a mounting substrate 150 having a thickness of 40–200 $\mu$m.

In the illustrated embodiment, the active region 120 and the conductive pattern 130 are contained within a void formed by a recess 145 in the bonding region 140 of the device substrate 110, the active region 120 thereby sunken into the device substrate 110 relative to the bonding region 140. However, it should be understood by those skilled in the art that while the void formed by the recess 145 in bonding region 140 is desirable in some applications, the active region 120 and the electrically conductive pattern 130 contained therein may also be located directly on the surface of the device substrate 110 including the bonding region 140, such an alternative embodiment thus excluding the recess 145.

In the illustrated embodiment, the mounting substrate 150 includes a void formed by a recess 165 in a central region of the bonding region 160, the central region thereby sunken into the mounting substrate 150 relative to the bonding region 160. While in the illustrated embodiment a void is formed by both the recess 145 and the recess 165, some applications need not include the recess 165 formed in the bonding region 160.

The nonmetallic hermetic sealing adhesive 180 is located between the device substrate 110 and the mounting substrate 150 and adheres the bonding region 140 of the device substrate 110 to the bonding region 160 of the mounting substrate 150. The adhesive 180 may include acrylate or benzocyclobutene coated with at least one selected from the group consisting of silicon nitride, silicon carbide, silicon oxide, aluminum nitride and aluminum oxide. Those skilled in the art will understand, however, that other materials may be suitable for use as the adhesive 180, depending upon the particular application involved.

The bonding of the two bonding regions 140, 160 creates a hermetic seal around the active area 120 and the electrically conductive pattern 130 contained therein. Those skilled in the art will understand that forming both the recess 165 and the recess 145 is not necessary to form the void proximate the active region 120 containing the electrically conductive pattern 130, and that the void may be formed by only a recess patterned in the adhesive 180.

In one embodiment, the void formed by the recesses 145, 165 and/or the pattern of the adhesive 180 is evacuated prior to adhering the bonding surfaces 140, 160, such that the void contains a vacuum upon sealing. By evacuating the void and subsequently sealing the void by means of the hermetic seal created by the hermetic sealing adhesive 180, operation of the electronic device partially formed by the electrically conductive pattern 180 will not be disturbed or otherwise influenced by unwanted solids, liquids, particulate or other contaminants. In this manner, an unpassivated, piezoelectric-sensitive electronic device may nonetheless be protected to ensure predictable performance.

In the illustrated embodiment, the electrically conductive pattern 130 may include SAW conductors. Such SAW conductors may cooperate to form multiple SAW resonators or other typical SAW circuits. Those skilled in the art should recognize that the conductive pattern 130 is not limited by the scope of the present invention to SAW applications, and that the architecture of the package 100 is equally beneficial to applications calling for other piezoelectric, MEMS or mirror devices that would benefit from the hermetic passivation and exposed circuit contacts provided by this architecture.

Figure 5:
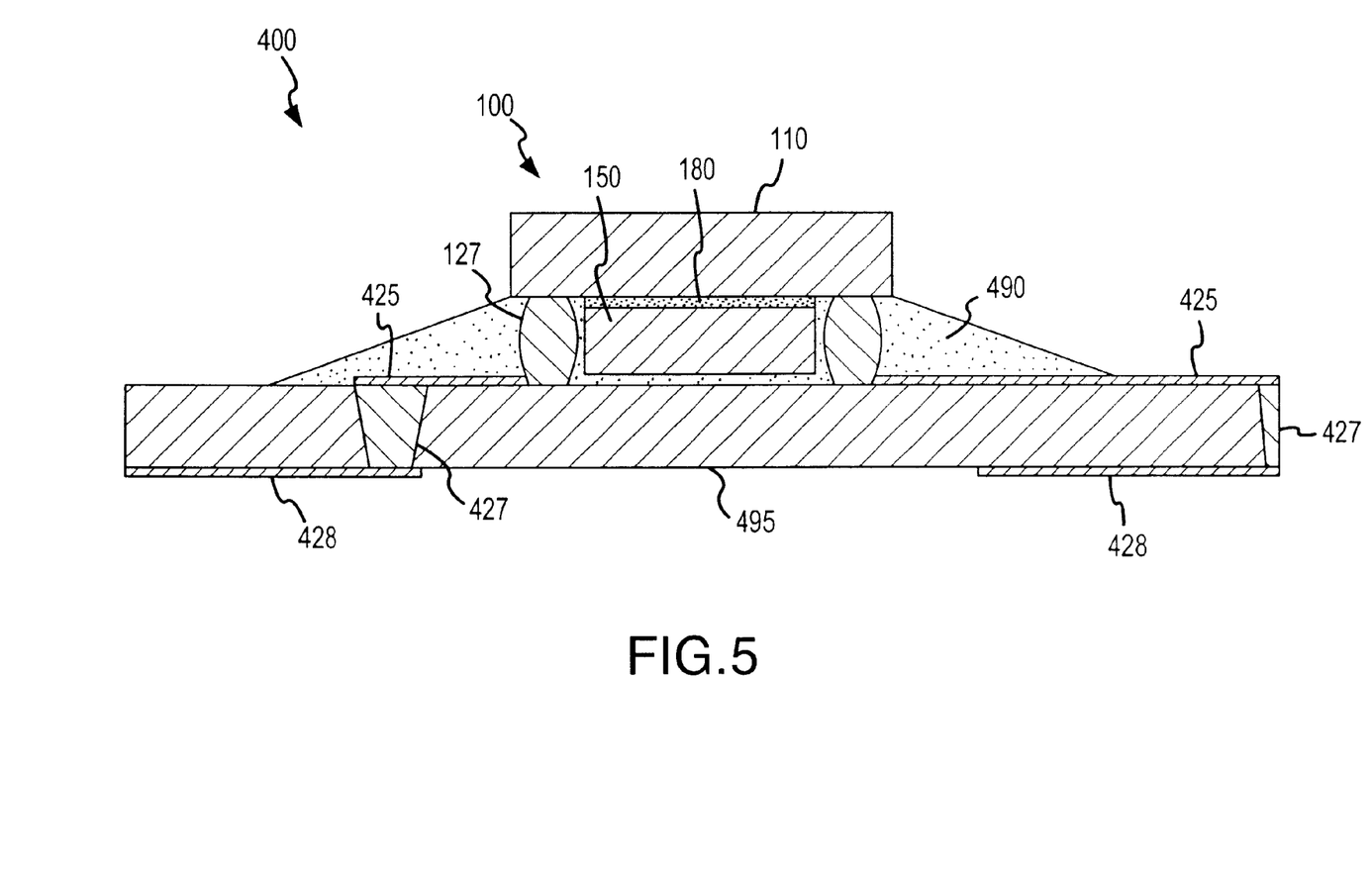
FIG. 5 illustrates another embodiment of the electronic device constructed according to the principles of the present invention.

Turning to FIG. 5, illustrated is another embodiment of the electronic device constructed according to the principles of the present invention. The module 400 includes the package 100 illustrated in FIG. 1 coupled to a carrier substrate 495. In the illustrated embodiment, the package 100 is mechanically and electrically coupled to the carrier substrate 495 by one or more vertical conductors 127 which, in the illustrated embodiment, are electrically conductive. The carrier substrate 495 may be substantially larger than the mounting substrate 150. For example, in one embodiment the mounting substrate 150 may have a 1 mm square footprint, while the carrier substrate 495 may have a 3 mm square footprint.

In the illustrated embodiment, the vertical conductors 127 may separate the carrier substrate 495 from the mounting substrate 150 by as much as 100 $\mu$m. However, those skilled in the art will understand that the separation between the carrier substrate 495 and the mounting substrate 150 may vary within the scope of the present invention, and that in one embodiment the mounting substrate 150 and the carrier substrate 495 may contact, such that no gap exists. As is familiar to those skilled in the art, the vertical conductors 127 may be thermosonic gold stud bumps, such as those installed via thermosonic scrubbing.

In one embodiment, the carrier substrate 495 may include one of many organic or inorganic materials, such as silicon, ceramic, polyimide, FR4, or BT resin, and may have a thickness of 50–250 $\mu$m. The carrier substrate 495 may have a conductive pattern 425 including conductive traces and pads, the pads accommodating connection with the mounting substrate 150 through the vertical conductors 127 and/or a conductive paste or adhesive (not shown). Such a paste or adhesive may be solder, isotropic or anisotropic conductive paste or adhesive.

In one embodiment, the carrier substrate 495 may include surface mount pads 428 on a surface opposite the conductive pattern 425. Conductors 427, which may be conventional vias or trenches, may electrically connect the conductive pattern 425 to the surface mount pads 428.

As is the illustrated embodiment, the package 400 may further include a mounting material 490 formed between the device substrate 110 and the carrier substrate 495 and around the mounting substrate 150 and the vertical conductors 127. The mounting material 490 may include anisotropic conductive paste or adhesive or standard epoxy employed as underfill in conventional flip-chip mounting processes. The mounting material 490 may be applied dispense or screen printing.

Figure 6:
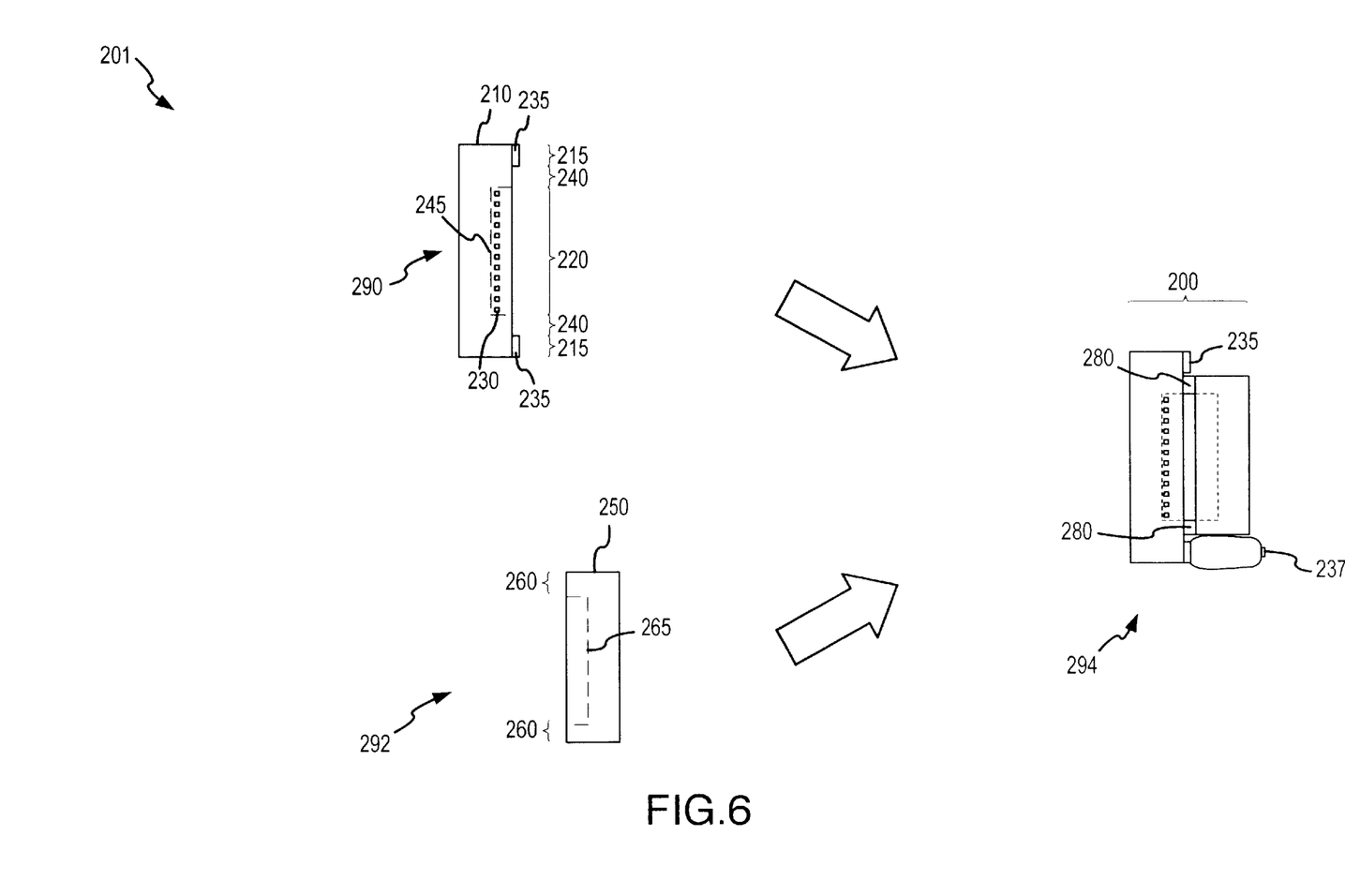
FIG. 6 illustrates a method of manufacturing a hermetic package for an electronic device according to the principles of the present invention.

Turning now to FIG. 6, illustrated is a method 201 of manufacturing an embodiment of an electronic device hermetic package 200, which in the present embodiment may be similar to the package 100 illustrated in FIGS. 1–4. The method 201 begins at a step 290, wherein a device substrate 210 is provided. The device substrate 210 may include at least one selected from the group consisting of bismuth germanium oxide, gallium arsenide, lithium borate, lithium niobate, lithium tantalate, langasite, lead zirconium tantalate and quartz. Those skilled in the art will understand, however, that other materials may be suitable for use as the device substrate 210, depending upon the particular application involved.

The device substrate 210 includes an active region 220, containing an electrically conductive pattern 230 that constitutes at least a portion of an electronic device and a bonding region 240 surrounding the active region 220. The device substrate 210 also includes a contact region 215 surrounding the active region 220 and containing bond pads 235 electrically coupled to the conductive pattern 230. In the illustrated embodiment, the contact region 215 surrounds both the active region 220 and the bonding region 240.

In the illustrated embodiment, the active region 220 is located within a void formed by a recess 245 in the bonding region 240, the active region 220 thereby sunken into the device substrate 210 relative to the bonding region 240. However, it should be understood by those skilled in the art that while the void formed by the recess 245 in bonding region 240 is desirable in some applications, the active region 220 and the electrically conductive pattern 230 contained therein may also be located directly on the surface of the device substrate 210 including the bonding region 240, such an alternative embodiment thus excluding the recess 245.

In a step 292, a non-porous mounting substrate 250 is formed. The mounting substrate 250, which may include ceramic and/or silicon, includes a bonding region 260 thereon, a footprint of the bonding region 260 at least partially conforming to a footprint of the bonding region 240. In a preferred embodiment, the mounting substrate 250 is 50–100 μm thick, but other embodiments may include a mounting substrate 250 having a thickness of 40–200 μm.

In the illustrated embodiment, mounting substrate 250 includes a void formed by a recess 265 in a central region of the bonding region 260, the central region thereby sunken into the mounting substrate 250 relative to the bonding region 260. While in the illustrated embodiment the void is formed by both the recess 245 and the recess 265, some applications need not include the recess 265 formed in the bonding region 260.

In a final step 294, a nonmetallic hermetic sealing adhesive 280 is located between the device substrate 210 and the mounting substrate 250 and adheres the two bonding regions 240, 260 to one another. The bonding of the two bonding regions 240, 260 creates a hermetic seal around the active area 220 and the electrically conductive pattern 230 contained therein.

Those skilled in the art will understand that forming both the recess 265 or the recess 245 is not necessary to form the void proximate the active region 220 containing the electrically conductive pattern 230, and that the void may be formed by only a recess patterned the adhesive 280. In one embodiment, the void formed by the recesses 245, 265 and/or the pattern of the adhesive 280 is evacuated prior to adhering the bonding surfaces 240, 260, such that the void contains a vacuum upon sealing. By evacuating the void and subsequently sealing the void by means of the hermetic seal created by the hermetic sealing adhesive 280, operation of the electronic device partially formed by the electrically conductive pattern 280 will not be disturbed or otherwise influenced by unwanted solids, liquids, particulate or other contaminants. In this manner, an unpassivated, piezoelectric-sensitive electronic device may nonetheless be protected to ensure predictable performance.

In the illustrated embodiment, a footprint of the device substrate 210 exceeds a footprint of the mounting substrate 250 at least to the extent that the portions of the contact region 215 containing the bond pads 235 remain exposed. In the illustrated embodiment, the device substrate 210 and mounting substrate 250 have a substantially quadrilateral footprint. However, in one embodiment, the footprint of the mounting substrate 250 may take on a more irregular shape, and may include scalloped or notched features exposing those portions of the contact region 215 containing the bond pads 235.

In one embodiment, the contact region 215 is exposed to allow the bond pads 235 to be used for wire bonding. Of course, other methods of electrically coupling the packaged device 200 to surrounding circuitry are within the broad scope of the present invention. In the illustrated embodiment, one or more vertical conductors 237 are in electrical communication with one or more bond pads 235, thereby providing means for mechanically and/or electrically coupling the package 200 to external circuitry (not shown). The vertical conductors 237 may be stud bumps, such as those formed by melting a sphere of metal at the tip of a conductive wire and cutting the wire above the sphere to form a tail. The vertical conductors 237 may also be simultaneously flattened to ensure uniform height thereof. In one embodiment, the vertical conductors 237 are at least as tall as the mounting substrate 250. In an alternative embodiment, the vertical conductors 237 may include a conventional conductive paste (not shown).

In the illustrated embodiment, the electrically conductive pattern 230 may include SAW conductors. Such SAW conductors may cooperate to form multiple SAW resonators or other typical SAW circuits. Those skilled in the art should recognize that the conductive pattern 230 is not limited by the scope of the present invention to SAW applications, and that the architecture of the package 200 is equally beneficial to applications calling for other piezoelectric, MEMS or mirror devices that would benefit from the hermetic passivation and pyro-electric sensitivity ensured by this architecture.

Figure 7A:
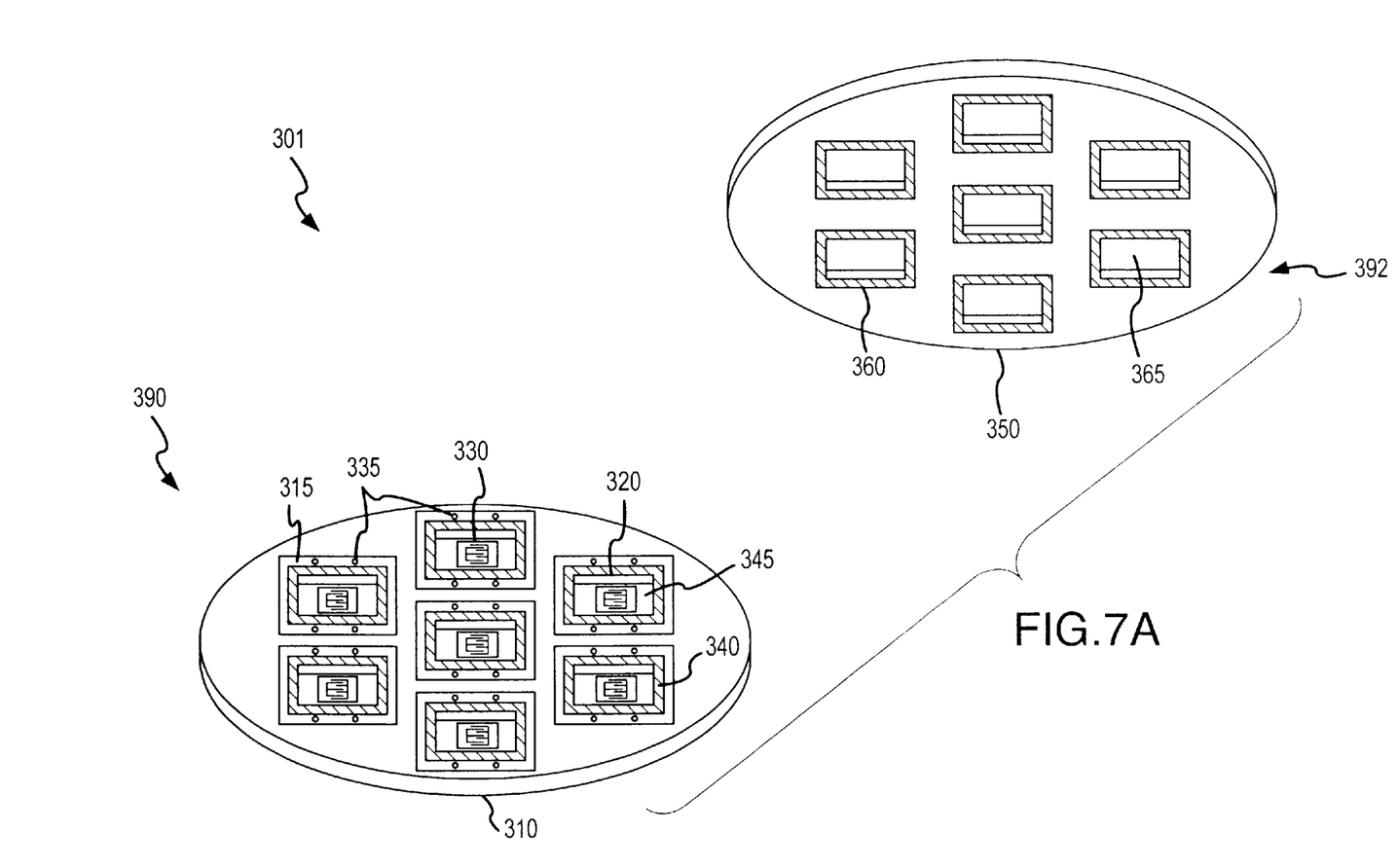
FIGS. 7A and 7B illustrate a method of manufacturing a the principles of the present invention.
Figure 7B:
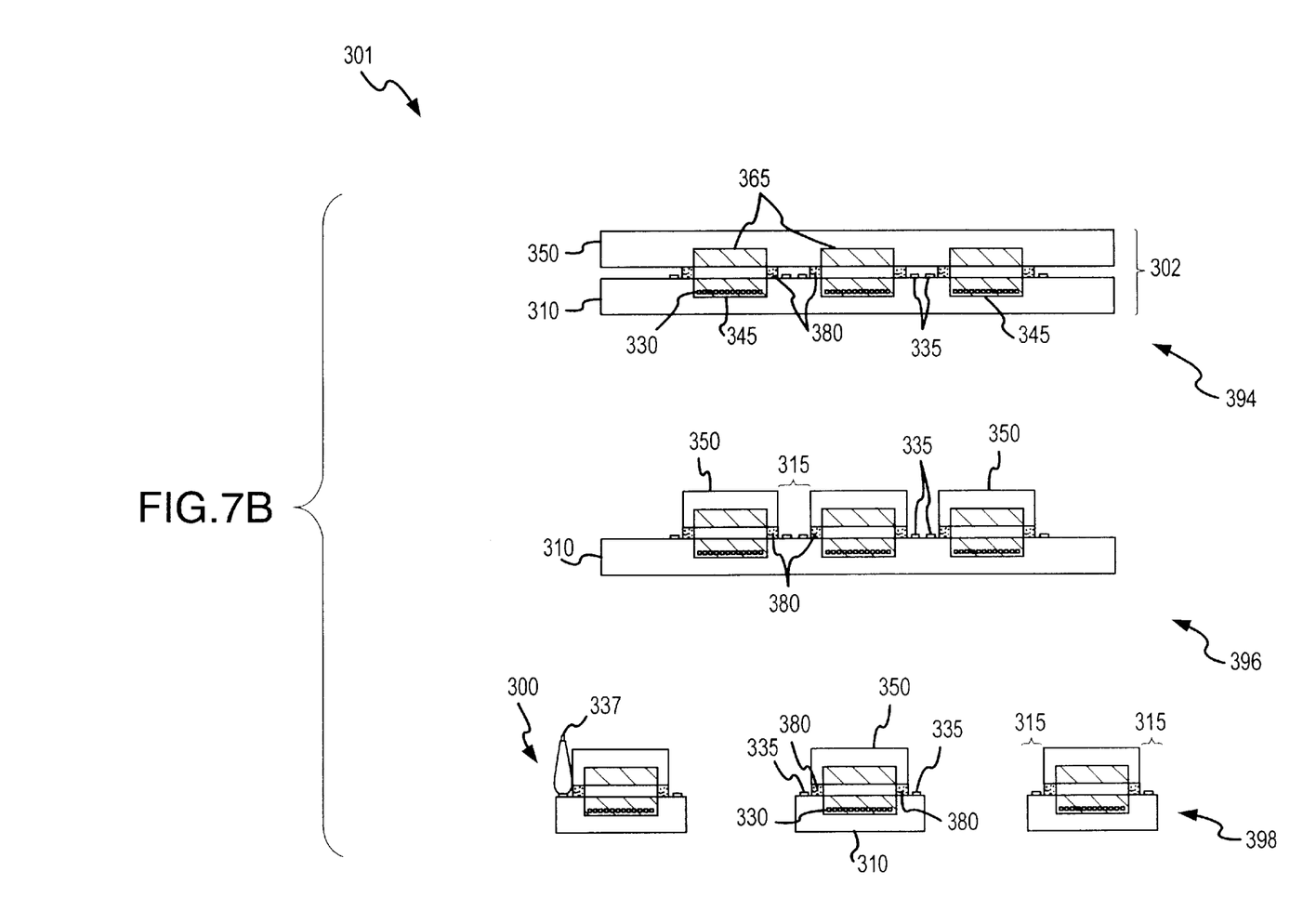

Turning now to FIGS. 7A and 7B, illustrated is a method 301 of manufacturing an embodiment of a hermetic package 302 including a plurality of SAW devices. The method 301 begins at a step 390, wherein a plurality of SAW devices is arranged on a device substrate wafer 310. The device substrate wafer 310 may include at least one selected from the group consisting of bismuth germanium oxide, gallium arsenide, lithium borate, lithium niobate, lithium tantalate, langasite, lead zirconium tantalate and quartz. Those skilled in the art will understand, however, that other materials may be suitable for use as the device substrate 310 depending upon the particular application involved.

The device substrate wafer 310 includes a plurality of active regions 320, each of the plurality of active regions 320 containing an electrically conductive pattern 330 that constitutes at least a portion of a SAW device, and a plurality of bonding regions 340, each of the plurality of bonding regions 340 surrounding a corresponding active region 320. The device substrate 310 also includes a plurality of contact regions 315 surrounding the active regions 320 and containing bond pads 335 electrically coupled to the conductive patterns 330. In the illustrated embodiment, the contact regions 315 each surround both an active region 320 and a bonding region 340.

In the illustrated embodiment, each of the plurality of active regions 320 is located within a corresponding one of a plurality of voids each formed by a recess 345 in one of the plurality of bonding regions 340. Each active region 320 is thereby sunken into the device substrate wafer 310 relative to a corresponding bonding region 340. However, it should be understood by those skilled in the art that while the plurality of voids formed by the plurality of recesses 345 in the plurality of bonding regions 340 is desirable in some applications, the plurality of active regions 320 and the plurality of electrically conductive patterns 330 contained therein may also be located on the surface of the device substrate wafer 310 including the plurality of bonding regions 340, such an alternative embodiment thus excluding the plurality of recesses 345.

In a step 392, a non-porous mounting substrate 350 is formed. The mounting substrate 350, which may include ceramic and/or silicon, includes a plurality of bonding regions 360 thereon, a footprint of each of the plurality of bonding regions 360 at least partially conforming to a footprint a corresponding one of the plurality of the bonding regions 340. In a preferred embodiment, the mounting substrate 350 is 50–100 μm thick, but other embodiments may include a mounting substrate 350 having a thickness of 40–200 μm.

In the illustrated embodiment, the mounting substrate 350 includes a plurality of voids each formed by one of a plurality of recesses 365 in a central region of a corresponding one of the plurality of bonding regions 360, each central region thereby sunken into the mounting substrate 350 relative to the corresponding bonding region 360. While in the illustrated embodiment each of the plurality of voids is formed by both a recess 345 and a recess 365, some applications need not include a recess 365 formed in a bonding region 360.

In a step 394, a nonmetallic hermetic sealing adhesive 380 is introduced between the device substrate wafer 310 and the mounting substrate 350 and adheres a corresponding pair of bonding regions 340, 360 to one another. The bonding of the two bonding regions 340, 360 creates a hermetic seal around the corresponding active area 320 and the electrically conductive pattern 330 contained therein.

Those skilled in the art will understand that forming both the recess 365 or the recess 345 is not necessary to form the void proximate the active region 320 containing the electrically conductive pattern 330, and that the void may be formed by only a recess patterned the adhesive 380. In one embodiment, each of the plurality of voids formed by the recesses 345, 365 and/or the pattern of the adhesive 380 is evacuated prior to adhering the corresponding pair of bonding surfaces 340, 360, such that each void contains a vacuum upon sealing.

By evacuating the plurality of voids and subsequently sealing the voids by means of the hermetic seal created by the hermetic sealing adhesive 380, operation of each of the SAW devices partially formed by the plurality of electrically conductive patterns 380 will not be disturbed or otherwise influenced by unwanted solids, liquids, particulate or other contaminants. In this manner, a plurality of unpassivated, pyroelectric-sensitive and contact-sensitive SAW devices may nonetheless be protected to ensure predictable performance.

In a step 396, portions of the mounting substrate 350 are removed at least to the extent that the portions of the contact regions 315 containing the bond pads 335 become exposed. In the illustrated embodiment, each of the resulting mounting substrates 350 takes on a quadrilateral footprint as a result of the material removal, thereby exposing the adjacent bond pads 335 for subsequent circuit integration. However, in one embodiment, the footprints of the mounting substrates resulting from the material removal may take on a more irregular shape, and may include scalloped or notched features exposing those portions of the contact regions 315 containing the bond pads 335.

In a final step 398, the packaged hermetic wafer assembly 302 may be separated into individual hermetic packages 300, each package containing one or more electronic devices. In an exemplary embodiment, the hermetic wafer assembly 302 may be separated into the individual hermetic packages 300 using wafer dicing, however, one skilled in the art understands that any compatible separation technique may be used.

In one embodiment, the contact regions 315 are exposed to allow the bond pads 335 to be used for wire bonding. Of course, other methods of electrically coupling the packaged devices 300 to surrounding circuitry are within the broad scope of the present invention. In the illustrated embodiment, one or more vertical conductors 337 are in electrical communication with one or more bond pads 335, thereby providing means for mechanically and/or electrically coupling the package 300 to external circuitry (not shown). The vertical conductors 337 may be stud bumps, such as those formed by melting a sphere of metal at the tip of a conductive wire and cutting the wire above the sphere to form a tail. The vertical conductors 337 may also be simultaneously flattened to ensure uniform height thereof. In one embodiment, the vertical conductors 337 are at least as tall as the mounting substrate 350. In an alternative embodiment, the vertical conductors 337 may include a conventional conductive paste (not shown).

Method 301 may include an additional step (not shown), wherein a passivation layer is formed over at least a portion of the mounting substrate 350, spanning the mounting substrate 350 and the device substrate wafer 310. The passivation layer is primarily employed to resolve any mechanical or handling issues that may arise. By protecting the package 300 with the passivation layer, the threat of damage encountered in subsequent manual or automated handling and assembly procedures (e.g., pick-and-place procedures) may be mitigated. The passivation layer may include bismuth germanium oxide, gallium arsenide, lithium borate, lithium niobate, lithium tantalate, langasite, lead zirconium tantalate, quartz, ceramic, silicon, Pyrex® or any other similar material or a combination thereof. The passivation layer may be applied to the wafer-scale package 302 or the individual packages 300 either by injection, transfer molding or liquid disposition.

In the illustrated embodiment, the electrically conductive pattern 330 may include SAW conductors. Such SAW conductors may cooperate to form multiple SAW resonators or other typical SAW circuits. Those skilled in the art should recognize that each of the plurality of conductive patterns 330 is not limited by the scope of the present invention to SAW applications, and that the architecture of the package 300 is equally beneficial to applications calling for other piezoelectric, MEMS or mirror devices that would benefit from the hermetic passivation and pyro-electric sensitivity ensured by this architecture.

Although the present invention has been described in detail, those skilled in the art should understand that they can make various changes, substitutions and alterations herein without departing from the spirit and scope of the invention in its broadest form.

What is claimed is:

1. A hermetic package for an electronic device, comprising:
   a device substrate having:
      an active region containing an electrically conductive pattern that constitutes at least a portion of said device,
      a contact region surrounding said active region and containing bond pads that are electrically coupled to said pattern, and
      a bonding region surrounding said active region;
   a non-porous mounting substrate having a bonding region thereon and a footprint smaller than a footprint of said device substrate; and
   a bonding agent, located between said bonding region of said device substrate and said bonding region of said mounting substrate, that bonds said device substrate to said mounting substrate to enclose said active region proximate a void between said device substrate and said mounting substrate, said contact region remaining exposed.

2. The package as recited in claim 1 wherein at least a portion of said void is accommodated by a central region of at least one of said device substrate and said mounting substrate sunken into said bonding region thereof.

3. The package as recited in claim 1 wherein a recess in said bonding agent accommodates at least a portion of said void, said recess corresponding to said active region.

4. The package as recited in claim 1 wherein said contact region is exposed to allow said bond pads to be used for wire bonding.

5. The package as recited in claim 1 wherein said device substrate comprises at least one selected from the group consisting of:
   bismuth germanium oxide,
   gallium arsenide,
   lithium borate,
   lithium niobate,
   lithium tantalate,
   langasite,
   lead zirconium tantalate, and
   quartz.

6. The package as recited in claim 1 wherein said mounting substrate comprises at least one selected from the group consisting of:
   ceramic, and
   silicon.

7. The package as recited in claim 1 wherein said device is selected from the group consisting of:
   a surface acoustic wave device,
   a micro-electromechanical system device,
   a mirror device, and
   a piezoelectric device.

8. The package as recited in claim 1 wherein said footprint of said mounting substrate is a quadrilateral.

9. The package as recited in claim 1 further comprising at least one vertical conductor comprising an electrically conductive material, said at least one vertical conductor in electrical communication with said pattern.

10. The package as recited in claim 9 wherein said at least one vertical conductor is a stud bump.

11. The package as recited in claim 9 further comprising a carrier substrate coupled to said at least one vertical conductor, said carrier substrate having terminals on a mounting surface thereof in electrical communication with said pattern.

12. A method of manufacturing a hermetic package for an electronic device, comprising:
   forming a device substrate having:
      an active region containing an electrically conductive pattern that constitutes at least a portion of said device,
      a contact region surrounding said active region and containing bond pads that are electrically coupled to said pattern, and
      a bonding region surrounding said active region;
   forming a non-porous mounting substrate having a bonding region thereon and a footprint smaller than a footprint of said device substrate; and
   placing a bonding agent between said bonding region of said device substrate and said bonding region of said mounting substrate to bond said device substrate to said mounting substrate to enclose said active region proximate a void between said device substrate and said mounting substrate, said contact region remaining exposed.

13. The method as recited in claim 12 wherein at least a portion of said void is accommodated by a central region of at least one of said device substrate and said mounting substrate sunken into said bonding region thereof.

14. The method as recited in claim 12 wherein a recess in said bonding agent accommodates at least a portion of said void, said recess corresponding to said active region.

15. The method as recited in claim 12 wherein said contact region is exposed to allow said bond pads to be used for wire bonding.

16. The method as recited in claim 12 wherein said forming said device substrate comprises forming a device substrate comprising at least one selected from the group consisting of:
   bismuth germanium oxide,
   gallium arsenide,
   lithium borate,
   lithium niobate,
   lithium tantalate,
   langasite,
   lead zirconium tantalate, and
   quartz.

17. The method as recited in claim 12 wherein said forming said non-porous mounting substrate comprises forming a mounting substrate comprising at least one selected from the group consisting of:
   ceramic, and
   silicon.

18. The method as recited in claim 12 wherein said device is selected from the group consisting of:
   a surface acoustic wave device,
   a micro-electromechanical system device,
   a mirror device, and
   a piezoelectric device.

19. The method as recited in claim 12 wherein said footprint of said mounting substrate is a quadrilateral.

20. The method as recited in claim 12 further comprising forming at least one vertical conductor comprising an electrically conductive material, said at least one vertical conductor in electrical communication with said pattern.

21. The method as recited in claim 20 wherein said at least one vertical conductor is a stud bump.

22. The method as recited in claim 20 further comprising coupling a carrier substrate to said at least one vertical conductor, said carrier substrate having terminals on a mounting surface thereof in electrical communication with said pattern.

23. A method of manufacturing a hermetic package for a plurality of surface acoustic wave (SAW) devices, comprising:
   arranging said plurality of SAW devices on a device substrate wafer such that active regions thereof are surrounded by contact regions containing bond pads that are electrically coupled to said SAW devices, said active regions also surrounded by bonding regions;
   forming a non-porous mounting substrate having bonding regions thereon that correspond to said bonding regions of said device substrate wafer;
   placing a bonding agent between said bonding regions of said device substrate wafer and said bonding regions of said mounting substrate, that bonds said device substrate to said mounting substrate to enclose said active regions proximate voids between said device substrate wafer and said mounting substrate; and removing at least a portion of said mounting substrate to expose said bond pads.

24. The method as recited in claim 23 wherein said active regions are sunken into said device substrate wafer relative to said bonding regions thereof to accommodate at least portions of said voids.

25. The method as recited in claim 23 wherein regions of said mounting substrate that correspond to said active regions are sunken into said mounting substrate relative to said bonding regions thereof to accommodate at least portions of said voids.

26. The method as recited in claim 23 wherein a plurality of recesses in said bonding agent accommodates at least a portion of said void, each of said recesses corresponding to one of said active regions.

27. The method as recited in claim 23 wherein said contact regions are exposed to allow said bond pads to be used for wire bonding.

28. The method as recited in claim 23 wherein said device substrate wafer is selected from the group consisting of:
    bismuth germanium oxide,
    gallium arsenide,
    lithium borate,
    lithium niobate,
    lithium tantalate,
    langasite,
    lead zirconium tantalate, and
    quartz.

29. The method as recited in claim 23 wherein said forming said non-porous mounting substrate comprises forming a mounting substrate comprising at least one selected from the group consisting of:
    ceramic, and
    silicon.

30. The method as recited in claim 23 wherein at least one of said plurality of devices is selected from the group consisting of:
    a surface acoustic wave device,
    a micro-electromechanical system device,
    a mirror device, and
    a piezoelectric device.

31. The method as recited in claim 23 further comprising forming at least one vertical conductor comprising an electrically conductive material, said at least one vertical conductor in electrical communication with said pattern.

32. The method as recited in claim 31 wherein said at least one vertical conductor is a stud bump.

* * * * *

UNITED STATES PATENT AND TRADEMARK OFFICE
CERTIFICATE OF CORRECTION

PATENT NO. : 6,639,150 B1
DATED : October 28, 2003
INVENTOR(S) : Goetz et al.

It is certified that error appears in the above-identified patent and that said Letters Patent is hereby corrected as shown below:

Column 3,
Line 62, after the words "manufacturing a" insert -- hermetic package for a plurality of electronic devices according to --

Signed and Sealed this

Sixteenth Day of March, 2004

JON W. DUDAS
*Acting Director of the United States Patent and Trademark Office*